United States Patent [19]
Vignola et al.

[11] Patent Number: 5,622,564
[45] Date of Patent: Apr. 22, 1997

[54] METALLIZING APPARATUS

[75] Inventors: Richard G. Vignola, Sarasota, Fla.; Richard Glanz, Crystal Lake, Ill.

[73] Assignee: Compu-Vac Systems, Inc., Sarasota, Fla.

[21] Appl. No.: 375,816

[22] Filed: Jan. 20, 1995

[51] Int. Cl.⁶ .................................................. C23C 16/00
[52] U.S. Cl. .......................................... 118/715; 118/726
[58] Field of Search .................................. 118/715, 719, 118/726, 728, 729

[56] References Cited

U.S. PATENT DOCUMENTS

| | | | |
|---|---|---|---|
| 2,384,500 | 9/1945 | Stoll | 118/718 |
| 3,303,320 | 2/1967 | Muller | 118/726 |
| 4,664,951 | 5/1987 | Doehler | 118/718 |

Primary Examiner—Nam Nguyen
Assistant Examiner—FeLisa Garrett

[57] ABSTRACT

An apparatus and process for continuous metallizing of components includes a first vacuum chamber having two ends capped by valves and a pair of rails running the length thereof. A shuttle rides on the rails and supports a carrier for holding a plurality of components. The first chamber may be opened to a housing having a plurality of boats for receiving strands of metal wire. The boats are connected to electrodes which heat the wire to vaporization temperature thereby providing a cloud of metal vapor to the first chamber. A chain travels through a channel provided in one of the rails for pulling the shuttle through the chamber until the shuttle contacts a pawl. The pawl prevents advancement of the shuttle. However, the carrier is provided with a clutch and bevel gear arrangement such that when the pawl engages the shuttle the clutch slips allowing the gears to rotate the carrier. The components held on the carrier are thereby exposed completely to the vapor cloud within the chamber.

25 Claims, 6 Drawing Sheets

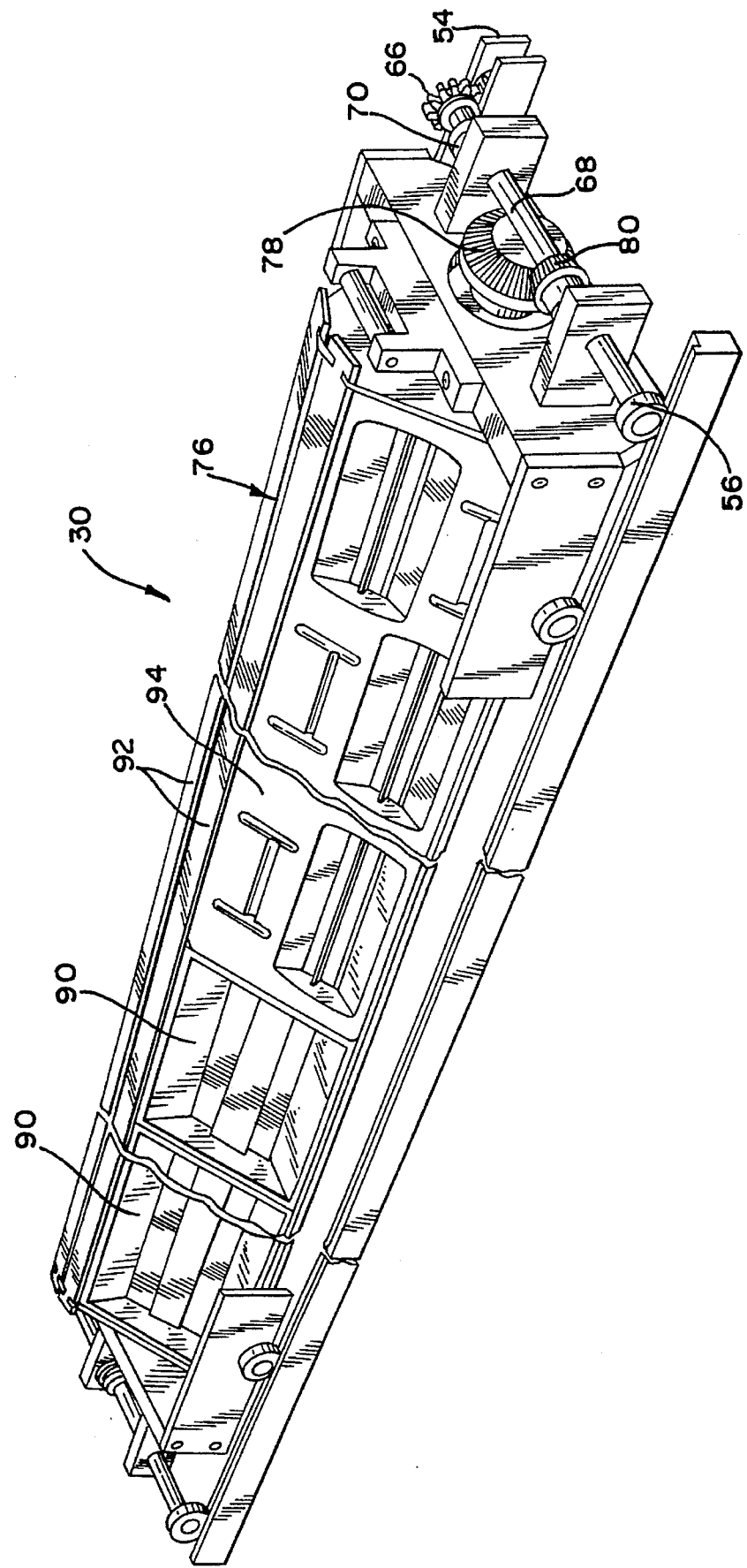

5,622,564

METALLIZING APPARATUS

BACKGROUND OF THE INVENTION

1. Field of the Invention

The present invention relates generally to vapor deposition metallizing apparatus and it relates more particularly to an apparatus and process for continuously transporting components to be metallized through a series of vacuum chambers.

2. Description of the Prior Art

Many articles of manufacture must be coated with metal for various reasons. One such article is a retroreflective highway marker comprising a metal coated lens having retroreflective cells. Typically, these lenses have lenses which are plastic. One method of coating the markers with a thin layer of metal, such as aluminum, is by the process of batch vapor deposition. In this process, the lenses are mounted to a carrier and masked to expose the surfaces to be metallized. The carrier is then placed in a large vacuum chamber wherein the air within the chamber is withdrawn to a vacuum on the order of $10^{-5}$ torr. A plurality of electric filaments having pieces of aluminum placed within them are energized such that the aluminum vaporizes and fills the chamber. The vapor is thereby deposited on the exposed surfaces of the lenses. The chamber is then brought back up to atmospheric pressure such that the chamber door can be opened and the carrier with metallized components can be removed. By this process a coating of metal on the order of 10,000 angstroms can be deposited on the components. Such a coating is sufficient to give a retroreflective lens a light reflective layer, of metal.

A disadvantage of known metallizing apparatus and processes is that a batch-type arrangement is time consuming to set up and implement. A single, large chamber requires considerable time for evacuation of the ambient air to the vacuum level needed for vapor deposition. Moreover, the loading and unloading of a large carrier can require considerable manpower. It is, therefore, desirable to provide an apparatus and process of continuous metallizing which can be accomplished more rapidly and without the need for numerous workers.

SUMMARY OF THE INVENTION

The present invention improves over the prior art by providing an apparatus and process for continuous metallizing of components. The invention comprises a first vacuum chamber having two ends capped by valves and a pair of rails running the length thereof. The first chamber is openly connected to a housing having a plurality of boats for receiving strands of metal wire. The boats are connected to electrodes which heat the boats and wire to vaporization temperature thereby providing a cloud of metal vapor to the first chamber. A shuttle rides on the rails and supports a carrier for holding a plurality of components to be metallized. The shuttle is provided with a sprocket which engages a chain. The chain travels through a channel provided in one of the rails and pulls the shuttle through the chamber until the shuttle contacts a pawl extending from the inside wall of the chamber. The pawl prevents advancement of the shuttle. However, the sprocket is connected through a clutch and bevel gear arrangement to the shuttle such that when the pawl engages the shuttle the clutch slips allowing the gears to rotate the carrier. The components held on the carrier are thereby exposed completely to the vapor cloud within the chamber. Second and third chambers may be positioned ahead of the first chamber and equipped with rails for transporting the shuttle from one chamber to the next in sequence. The second and third chambers may be provided with suitable vacuum generating apparatus for pre-evacuating the air from the chambers.

BRIEF DESCRIPTION OF THE DRAWINGS

The features and advantages of the invention will become apparent upon a reading of the following detailed description taken in connection with the accompanying drawings wherein:

FIG. 6 is a perspective view of a shuttle in accordance with the invention.

DETAILED DESCRIPTION OF THE PREFERRED EMBODIMENTS

Figure 1:
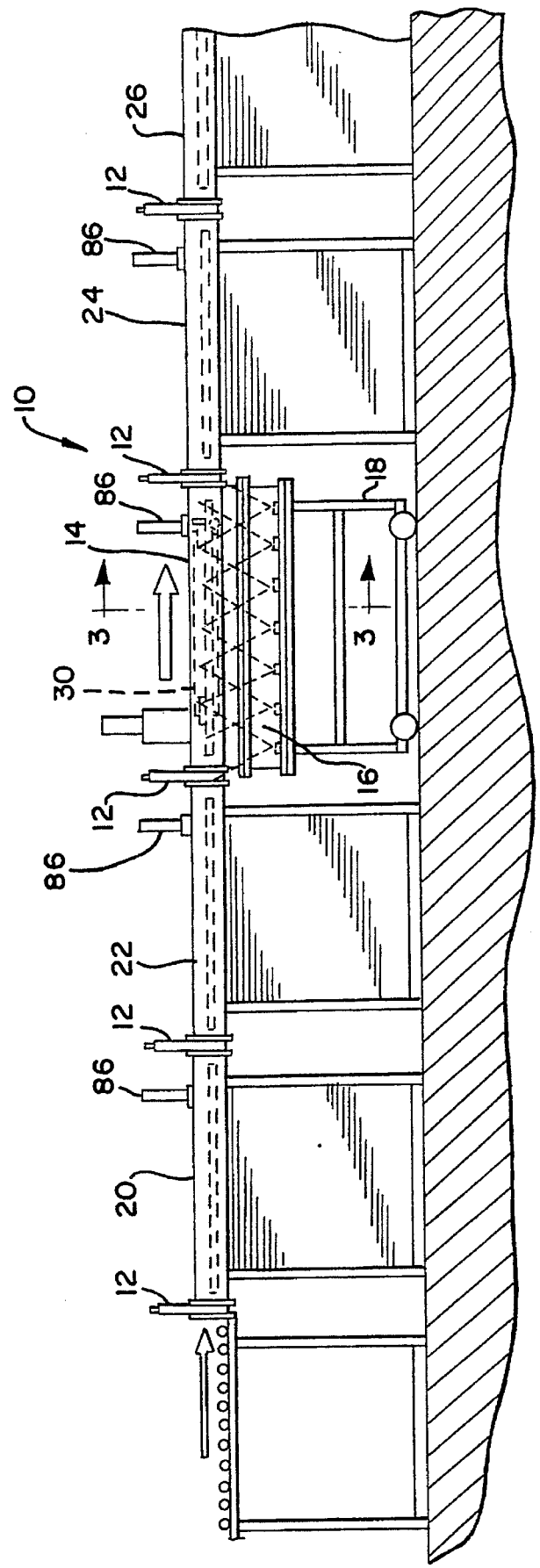
FIG. 1 is a schematic side elevational view of a metallizing apparatus in accordance with the invention.

Referring now to the drawings, and initially to FIG. 1, a metallizing apparatus in accordance with the invention is shown schematically and designated generally by the reference numeral 10. In a preferred form, the apparatus 10 includes five separate vacuum chambers, each formed from cylindrical or rectangular members and connected longitudinally in series by gate valves 12. A first middle firing chamber 15 is the chamber in which metal vapor deposition takes place. To this end, as will be described in detail hereinafter, the first chamber 14 is connected to a vapor generator 16 mounted to a suitable cart 18 so that the chamber 14 and generator 16 may be conveniently disconnected and moved for maintenance. Ahead of the middle chamber 14 are chambers 20 and 22. Chamber 20 is a preconditioning chamber capable of being evacuated to a vacuum of 500 microns. Chamber 22 is a second preconditioning chamber capable of being evacuated to a vacuum of $1\times10^{-4}$ torr of pressure. The middle firing chamber 14 is further evacuated to $1\times10^{-5}$ torr of pressure. Two chambers 24 and 26 are positioned in series after the firing chamber 14 and serve to bring the pressure back up to atmospheric pressure after the metallizing process takes place in chamber 14. A shuttle 30 is shown generally as positioned within chamber 14. The shuttle 30 is transported between the chambers 14, 20, 22, 24 and 26 by a conveying system, which will be described hereinafter. It can thus be appreciated that the apparatus 10 serves as a continuous means for transporting multiple shuttles 30 sequentially between the preconditioning chambers 20 and 22, into the firing chamber 14, and then into pressure adjusting chambers 24 and 26.

Figure 2:
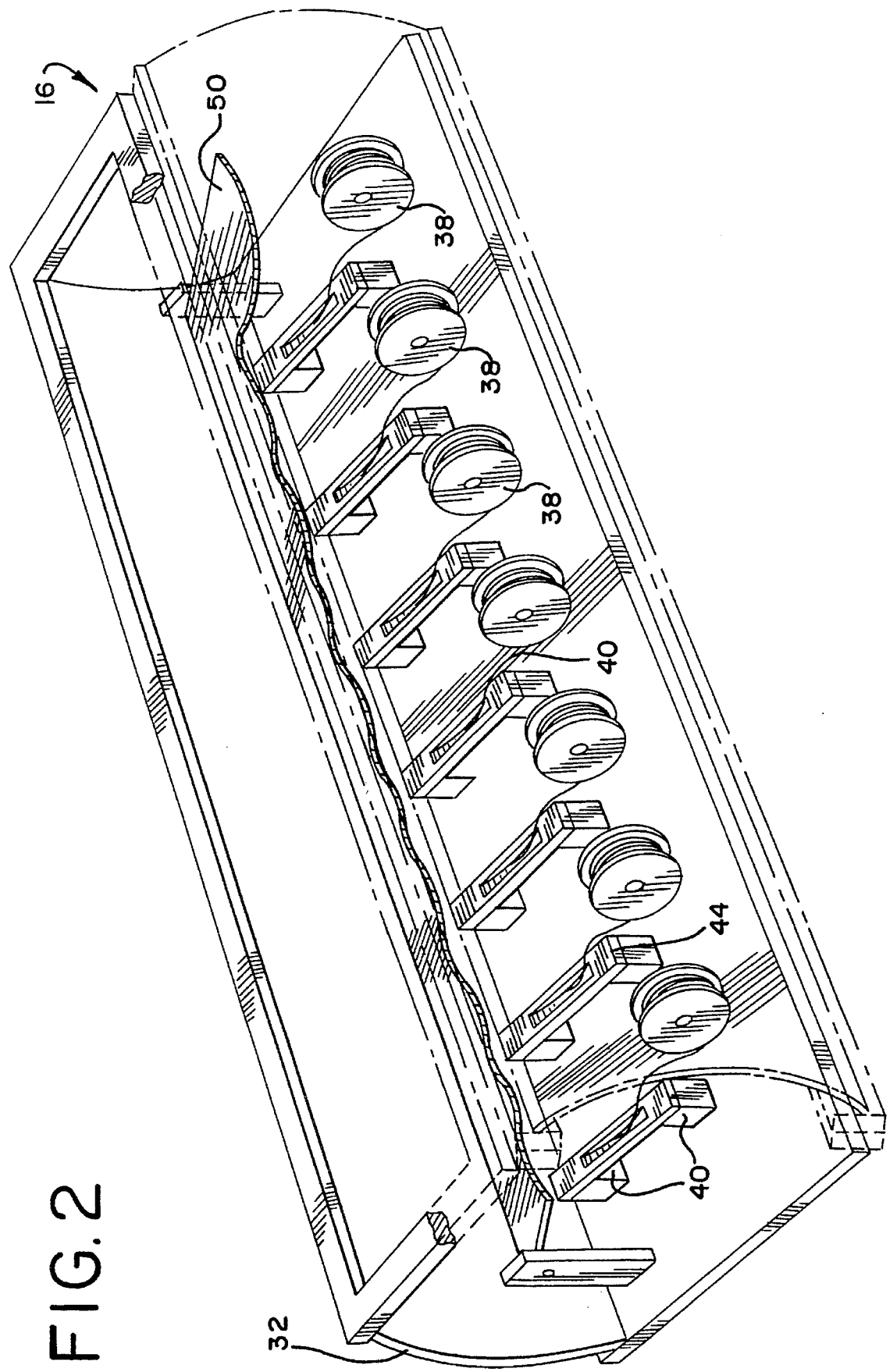
FIG. 2 is a perspective view of the metal vapor generator of the metallizing apparatus.
Figure 3:
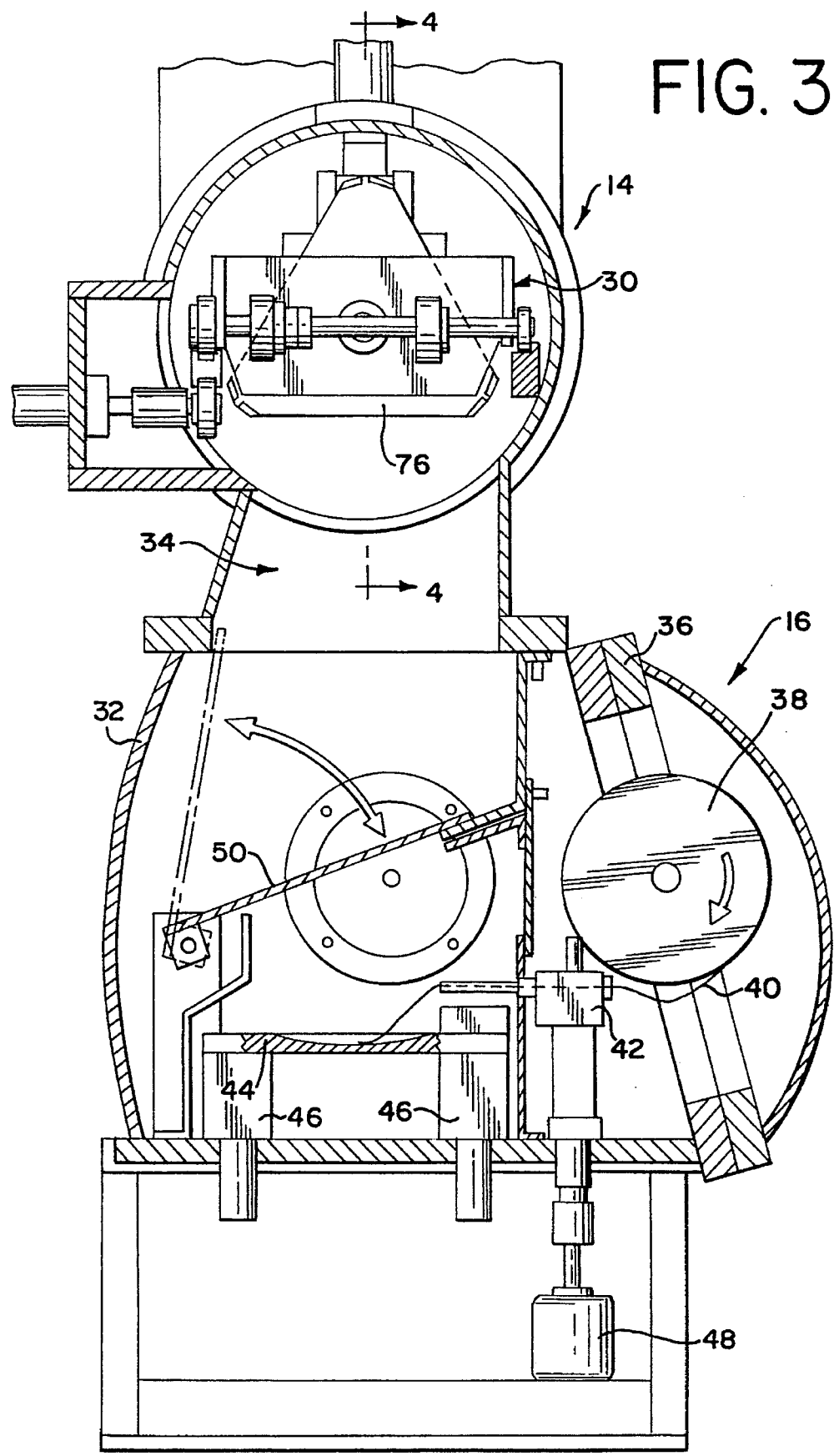
FIG. 3 is a cross-sectional view of one chamber of the apparatus as connected to the vapor generator.

Turning now to FIGS. 2 and 3, further details of the firing chamber 14 and vapor generator 16 can be seen. The vapor generator 16 is contained within a suitable housing 32 connected to the lower side of chamber 14 by a passage 34. Mounted within the housing 32 is a rack 36 which supports a plurality of spools 38 for rotation. When metallizing lenses for pavement markers, for example, the spools 38 preferably contain coils of aluminum wire 40. The wire 40 is fed through a gun 42 and drops into a metal boat 44 which is connected between a pair of electrodes 46. The wire 40 is intermittently advanced through the gun 42 by a suitable motor 48. The electrodes 46 are preferably connected to a twelve volt transformer capable of delivering 1000 amps. When energized, the electrodes 46 heat the boats 44 to 1600° C. A shutter 50 is provided to enclose the vapor generator 16 while the wire 40 flashes. After one second of flashing, the shutter opens to the chamber 14 and any residual oxygen in the chamber 14 is absorbed.

Figure 4:
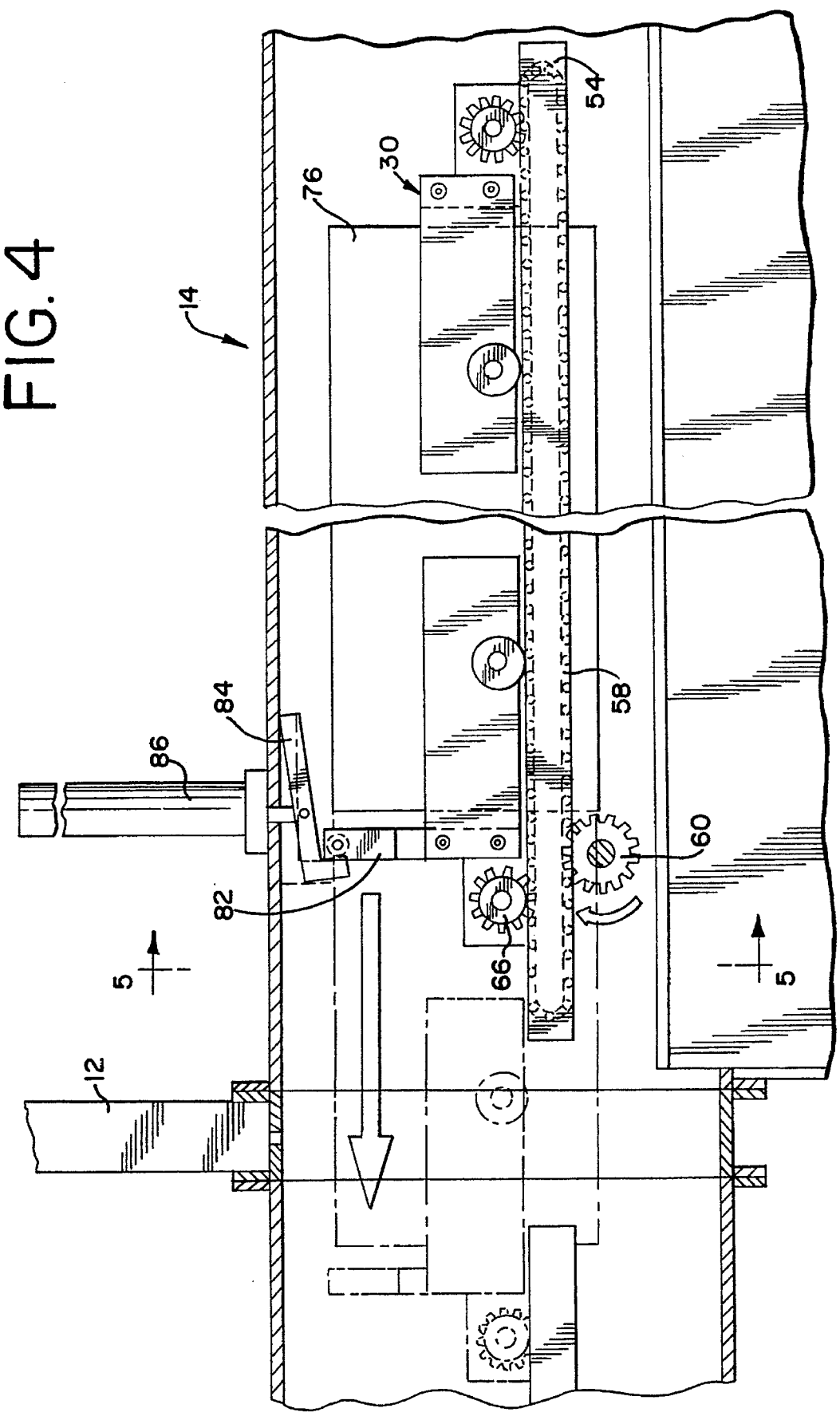
FIG. 4 is a cross-sectional view taken substantially along the line 4—4 of FIG. 3.
Figure 5:
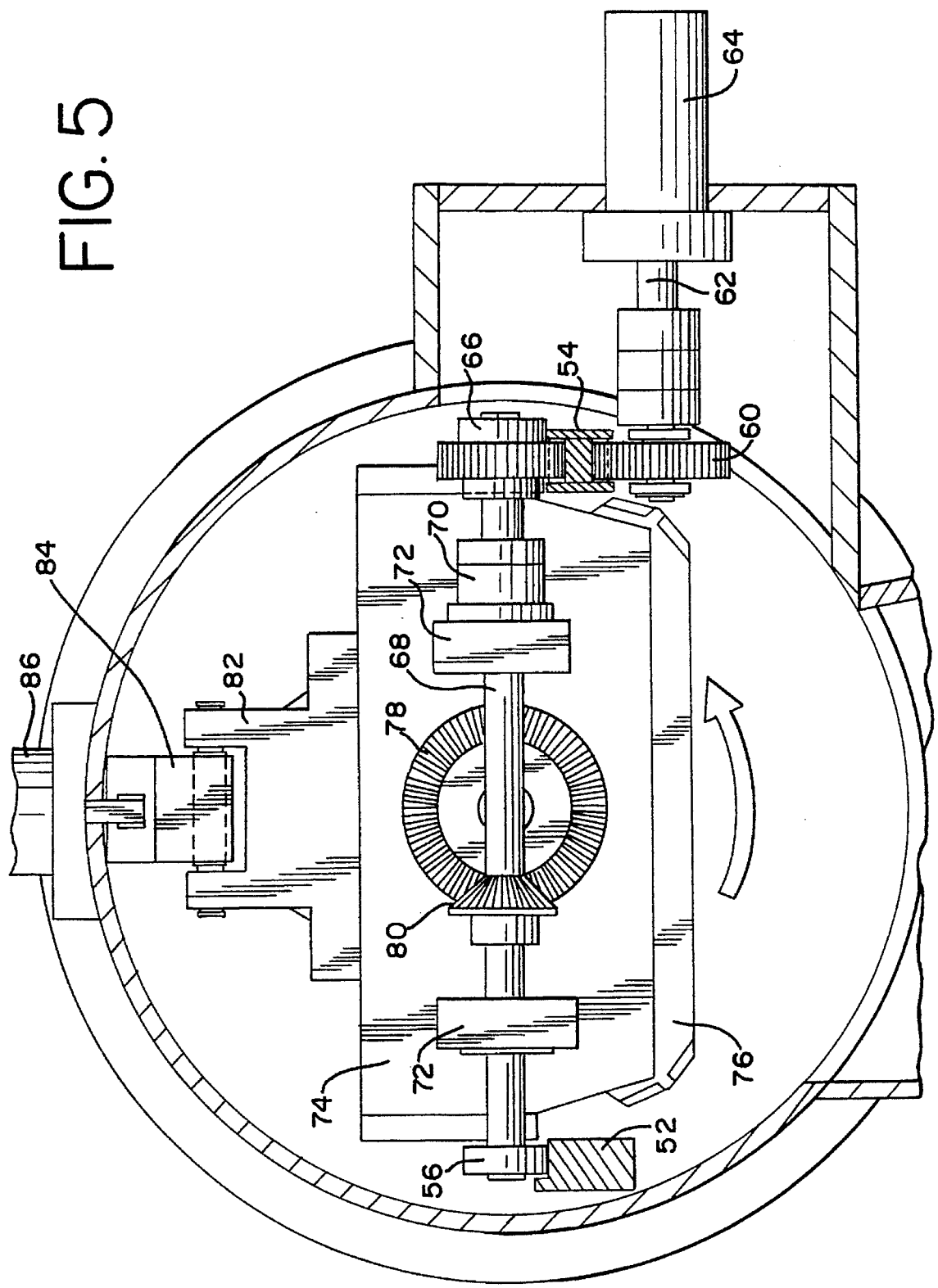
FIG. 5 is a cross-sectional view taken substantially along the line 5—5 of FIG. 4.

Referring now to FIGS. 4 and 5, the shuttle 30 conveying mechanism can be seen to include a pair of rails 52 and 54. Rail 52 is configured to support rollers 56 rotatably connected to the shuttle 30. Rail 54 is configured with an H-shaped cross-section providing upper and lower channels for receiving an endless chain 58. The chain is engaged by a drive sprocket 60 connected to a shaft 62 and driven by a motor 64. A combined sprocket and roller 66 rides on the top of the rail 54 and the sprocket portion extends into the channel of the rail 54 such that it is driven by the chain 58. Each chamber 14, 20, 22, 24 and 26 has a similar arrangement of rails 52 and 54, chain 58 and drive sprocket 60.

As best seen in FIG. 5, the sprocket 66 is connected to a shaft 68 through a clutch 70. The shaft 68 is journaled by suitable bearings 72 carried by an end wall 74 of the shuttle 30. Journaled for rotation relative to the wall 74 is a component carrier 76. The carrier 76 is connected to a bevel gear 78 which is driven by an engaging gear 80 mounted on the shaft 68. In accordance with the invention, the wall 74 is provided with a stop block 82. When the shuttle 30 has moved to a centered position within any one of the chambers 14, 20, 22, 24 or 26, a pawl 84 operated by an air cylinder 86 drops down into engagement with the stop block 82 thereby preventing the shuttle 30 from further forward movement within the respective chamber 14, 20, 22, 24 or 26. When the shuttle 30 is blocked by the pawl 84, the clutch 70 slips and the drive chain 56 causes the shaft 68 to rotate thereby rotating the gears 78 and 80 and, consequently, rotating the carrier 76. Accordingly, components mounted on the carrier 76 are rotated such that when the shuttle 30 is in the firing chamber 14 the components are completely exposed to metal vapor contained therein.

FIG. 6 best illustrates the shuttle 30. The carrier 76 of the shuttle 30 may be constructed in a variety of geometric configurations. However, in the embodiment illustrated, the carrier 76 has three sides for mounting pavement markers 90. Spring biased bars 92 lock the markers 90 in place. A suitable mask 94, shown only partially, may be placed over the markers 90 to prevent metal vapor from depositing on portions of the markers 90 which are to remain uncoated.

It can now be appreciated that the metallizing apparatus 10 of the present invention offers considerable advantages over prior art batch-type systems. Because the metallizing process is a continuous process, productivity is increased to twice the production rate of the conventional batch-type process. A further advantage resides in the use of the boats 44. The boats 44 essentially replace the filaments used in the batch-type process which are prone to breakage and have limited life requiring persistent maintenance. The boats 44 have a much longer life. Although the apparatus 10 is illustrated in a form suitable for metallizing pavement markers 90, it can be appreciated that virtually any type of component may be metallized within the apparatus 10 by appropriately modifying the carrier 76 to suitably support the components for transporting on the shuttle 30.

While the present invention has been described in connection with particular embodiments thereof, it will be understood by those skilled in the art that many changes and modifications may be made without departing from the true spirit and scope of the present invention. Therefore, it is intended by the appended claims to cover all such changes and modifications which come within the true spirit and scope of the invention.

What is claimed is:

1. A metallizing apparatus comprising:
   a chamber which can be selectively sealed from an atmosphere, having a first end and a second end, each end sealed by a valve;
   at least one rail running between the first and second ends of said chamber;
   a shuttle transportable on said rail for transporting components to be metallized between the first and second ends of said chamber; and
   means for generating metal vapor within said chamber.

2. The apparatus of claim 1 wherein said rail is provided with a channel and said channel receives an endless chain supported such that said chain travels longitudinally of said chamber within said channel.

3. The apparatus of claim 2 including a sprocket connected to said shuttle and configured to engage said chain to transport said shuttle on said rail.

4. The apparatus of claim 3 including a pair of bevel gears connected through a clutch to said sprocket.

5. The apparatus of claim 4 including means for blocking movement of said shuttle whereby said clutch slips and said bevel gears and carrier rotate.

6. A metallizing apparatus comprising:
   a first chamber which can be selectively sealed to an atmosphere;
   means for creating a vacuum within said first chamber;
   a second chamber connected at one end to said first chamber by a valve;
   means for creating a vacuum within said second chamber;
   a shuttle transportable between said first and second chambers, said shuttle configured to carry a plurality of components to be metallized; and
   means for generating metal vapor in said first chamber for depositing said metal vapor on said components.

7. The apparatus of claim 6 including a third chamber connected to a second end of said first chamber and means for creating a vacuum in said third chamber.

8. The apparatus of claim 6 wherein said metal vapor generating means includes means for vaporizing a metal wire.

9. The apparatus of claim 8 wherein said evaporator means includes a boat connected between a pair of electrically-charged electrodes.

10. The apparatus of claim 9 including means for feed metal wire into said boat.

11. The apparatus of claim 6 wherein said metal vapor generating means is disposed in a housing connected to said second chamber with a shutter.

12. The apparatus of claim 6 wherein said shuttle is transported on a pair of rails.

13. The apparatus of claim 12 wherein said rails are provided with channels for each receiving a chain.

14. The apparatus of claim 13 wherein said shuttle includes at least one sprocket engageable with said chain.

15. The apparatus of claim 14 wherein said sprocket is connected by a clutch to a pair of bevel gears.

16. The apparatus of claim 6 including a continuous chain supported within each chamber and engageable with said shuttle to transport said shuttle through said chambers.

17. The apparatus of claim 6 wherein said shuttle includes a carrier configured to support a plurality of components to be metallized.

18. The apparatus of claim 17 wherein said carrier is connected by a pair of bevel gears to a sprocket and said sprocket is engageable with a chain for transporting said shuttle within said chambers.

19. The apparatus of claim 18 including a rail running the length of said chamber with said shuttle transported on said rail.

20. The apparatus of claim 19 wherein said chain is supported for longitudinal movement within a channel formed in said rail.

21. The apparatus of claim 20 wherein said bevel gears are connected to said sprocket through a clutch.

22. The apparatus of claim 21 including a pawl connected to said chamber for selectively blocking said shuttle from movement within said chamber.

23. The apparatus of claim 22 wherein blocking of said shuttle by said pawl causes said clutch to slip and said bevel gears to rotate thereby rotating said carrier relative to said shuttle.

24. A metallizing apparatus comprising:

a first chamber which can be selectively sealed from an atmosphere;

means for creating a vacuum within said first chamber;

a second chamber connected at one end to said first chamber by a valve;

means for creating a vacuum within said second chamber;

a shuttle transportable between said first and second chambers;

a carrier mounted on said shuttle and configured to carry a plurality of components to be metallized, said carrier being supported for rotation on said shuttle; and means for generating metal vapor in said first chamber for depositing said metal vapor on said components.

25. A metallizing apparatus comprising:

a chamber which can be selectively sealed from an atmosphere, having a first end and a second end, each end sealed by a valve;

at least one rail running between the first and second ends of said chamber, said rail being provided with a channel for receiving an endless chain supported such that said chain travels longitudinally of said chamber within said channel;

a shuttle transportable on said rail for transporting components to be metallized between the first and second ends of said chamber;

a sprocket connected to said shuttle and configured to engage said chain to transport said shuttle on said rail;

a pair of bevel gears connected through a clutch to said sprocket;

a carrier mounted for rotation on said shuttle and connected to said bevel gears; and means for generating metal vapor within said chamber.

* * * * *